(12) United States Patent
Kim

(10) Patent No.: US 10,354,800 B2
(45) Date of Patent: Jul. 16, 2019

(54) MULTILAYER CERAMIC ELECTRONIC COMPONENT, METHOD OF MANUFACTURING THE SAME, AND PRINT CIRCUIT BOARD HAVING THE SAME EMBEDDED THEREIN

(71) Applicant: SAMSUNG ELECTRO-MECHANICS CO., LTD., Suwon-Si, Gyeonggi-Do (KR)

(72) Inventor: Tae Hyeok Kim, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 24 days.

(21) Appl. No.: 15/978,842

(22) Filed: May 14, 2018

(65) Prior Publication Data

US 2019/0148069 A1 May 16, 2019

(30) Foreign Application Priority Data

Nov. 10, 2017 (KR) .......................... 10-2017-0149057

(51) Int. Cl.
*H01G 4/232* (2006.01)
*H01G 4/30* (2006.01)
(Continued)

(52) U.S. Cl.
CPC .......... *H01G 4/2325* (2013.01); *H01G 4/012* (2013.01); *H01G 4/30* (2013.01); *H05K 1/115* (2013.01);
(Continued)

(58) Field of Classification Search
USPC ........................................................ 361/303
See application file for complete search history.

(56) References Cited

U.S. PATENT DOCUMENTS

| 965,992 | A | * | 8/1910 | Dean | ................. | H01G 4/015 |
| | | | | | | 361/273 |
| 2,899,345 | A | * | 8/1959 | Oshry | ................. | C23C 28/02 |
| | | | | | | 148/277 |

(Continued)

FOREIGN PATENT DOCUMENTS

| JP | 2005-123288 A | 5/2005 |
| KR | 10-1462767 B1 | 11/2014 |
| KR | 10-1630043 B1 | 6/2016 |

*Primary Examiner* — William H. Mayo, III
*Assistant Examiner* — Krystal Robinson
(74) *Attorney, Agent, or Firm* — Morgan, Lewis & Bockius, LLP

(57) ABSTRACT

A multilayer ceramic electronic component includes: a body having first to sixth surfaces, and including a plurality of dielectric layers and a plurality of first and second internal electrodes alternately disposed and exposed through the third and fourth surfaces, respectively; and first and second external electrodes disposed on the third and fourth surfaces of the body, respectively, and including first and second connected portions connected to the first and second internal electrodes, respectively, and first and second band portions extending from the first and second connected portions to portions of at least one of the first and second surfaces of the body, respectively. The external electrodes include conductive layers and plating layers, respectively, and surfaces of end portions of external electrodes are flat.

20 Claims, 6 Drawing Sheets

(51) Int. Cl.
   *H01G 4/012*   (2006.01)
   *H05K 1/18*   (2006.01)
   *H05K 1/11*   (2006.01)
   *H01G 4/248*   (2006.01)
   *H01G 4/12*   (2006.01)

(52) U.S. Cl.
   CPC ........... *H05K 1/186* (2013.01); *H01G 4/1227* (2013.01); *H01G 4/248* (2013.01); *H05K 2201/10015* (2013.01); *H05K 2201/10636* (2013.01)

(56) References Cited

U.S. PATENT DOCUMENTS

| | | | | |
|---|---|---|---|---|
| 3,235,939 A * | 2/1966 | Rodriguez | ............. | H01G 4/228 156/89.17 |
| 3,648,132 A * | 3/1972 | Rayburn | ................ | H01G 4/255 29/25.42 |
| 3,809,973 A * | 5/1974 | Hurley | ................ | H01G 4/0085 29/25.42 |
| 4,097,911 A * | 6/1978 | Dorrian | ................ | H01G 4/0085 29/25.42 |
| 4,228,482 A * | 10/1980 | Bouchard | ................ | C04B 35/47 252/62.9 R |
| 4,353,153 A * | 10/1982 | Prakash | .................... | C03C 8/18 29/25.42 |
| 4,458,294 A * | 7/1984 | Womack | ............. | H01G 4/2325 338/309 |
| 4,604,676 A * | 8/1986 | Senda | ................... | H01G 4/2325 361/309 |
| 4,740,863 A * | 4/1988 | Langlois | ................ | H01G 4/232 29/25.42 |
| 6,144,547 A * | 11/2000 | Retseptor | ................. | H01G 4/08 361/303 |
| 8,232,479 B2 * | 7/2012 | Satou | ...................... | H01G 2/065 174/126.1 |
| 8,674,234 B2 * | 3/2014 | Yoshii | .................... | H01G 2/065 174/260 |
| 9,024,206 B2 * | 5/2015 | Park | ........................ | H01G 4/30 174/260 |
| 9,336,946 B2 * | 5/2016 | Lee | ........................ | H01G 4/008 |
| 9,460,856 B2 * | 10/2016 | Park | ........................ | H01G 4/30 |
| 2004/0160751 A1 * | 8/2004 | Inagaki | ............... | H01L 21/4857 361/763 |
| 2005/0081987 A1 | 4/2005 | Takahara et al. | | |
| 2012/0147516 A1 * | 6/2012 | Kim | ........................ | H01G 4/232 361/301.4 |
| 2013/0241361 A1 * | 9/2013 | Lee | ......................... | H01G 4/30 310/366 |
| 2014/0131082 A1 * | 5/2014 | Ahn | ........................ | H05K 3/3442 174/260 |
| 2014/0138136 A1 * | 5/2014 | Ahn | ........................ | H01G 2/065 174/260 |
| 2014/0185186 A1 * | 7/2014 | Lee | ......................... | H01G 4/30 361/303 |
| 2014/0262463 A1 | 9/2014 | Lee et al. | | |
| 2014/0290998 A1 * | 10/2014 | Ahn | ......................... | H01G 4/30 174/260 |
| 2015/0380161 A1 | 12/2015 | Lim et al. | | |

* cited by examiner

MULTILAYER CERAMIC ELECTRONIC COMPONENT, METHOD OF MANUFACTURING THE SAME, AND PRINT CIRCUIT BOARD HAVING THE SAME EMBEDDED THEREIN

CROSS-REFERENCE TO RELATED APPLICATION(S)

This application claims benefit of priority to Korean Patent Application No. 10-2017-0149057 filed on Nov. 10, 2017 in the Korean Intellectual Property Office, the disclosure of which is incorporated herein by reference in its entirety.

TECHNICAL FIELD

The present disclosure relates to a multilayer ceramic electronic component, a method of manufacturing the same, and a printed circuit board having the same embedded therein.

BACKGROUND

In accordance with an increase in a density and a degree of integration of an electronic circuit, a mounting space of an electronic component on a printed circuit board has become insufficient. In order to solve such a problem, a method of embedding the electronic component in the printed circuit board has been suggested.

In an embedded multilayer ceramic electronic component, band portions of external electrodes are formed on one surface of a body in a thickness direction. However, in a structure in which external electrodes are formed in a printing manner such as dipping and plating layers are formed on the external electrodes by plating, a large deviation in a gap between the band portions may occur, and it may be difficult to adjust a size of the gap between the band portions to a level desired by a customer.

SUMMARY

An aspect of the present disclosure may provide a multilayer ceramic electronic component which may be embedded in a printed circuit board to secure a mounting space and in which a deviation of a gap between band portions may be significantly decreased and a size of the gap between the band portion may be easily adjusted, a method of manufacturing the same, and a printed circuit board having the same.

According to an aspect of the present disclosure, a multilayer ceramic electronic component may include: a body having first and second surfaces opposing each other, third and fourth surfaces connected to the first and second surfaces and opposing each other, and fifth and sixth surfaces connected to the first and second surfaces, connected to the third and fourth surfaces, and opposing each other, and including a plurality of dielectric layers and a plurality of first and second internal electrodes alternately disposed and exposed through the third and fourth surfaces, respectively, with respective dielectric layers interposed therebetween; and first and second external electrodes disposed on the third and fourth surfaces of the body, respectively, and including first and second connected portions connected to the first and second internal electrodes and first and second band portions extending from the first and second connected portions to portions of at least one of the first and second surfaces of the body, respectively. The first and second external electrodes may include first and second conductive layers disposed on the body, respectively, and first and second plating layers disposed on the first and second conductive layers, respectively, and surfaces of end portions of the first and second external electrodes may be flat.

The first and second band portions of the first and second external electrodes may include first and second lower band portions extending from one ends of the first and second connected portions to portions of the first surface of body, respectively, and first and second upper band portions extending from the other ends of the first and second connected portions to portions of the second surface of the body, respectively, and the first and second lower band portions and the first and second upper band portions may face each other in a length direction.

Lengths of the first and second lower band portions may be the same as each other, and lengths of the first and second upper band portions may be the same as each other.

A gap between the first and second lower band portions or a gap between the first and second upper band portions may be 10 μm or more.

The first band portion of the first external electrode may only be formed on a portion of the first surface of the body, and the other end portion of the first connected portion of the first external electrode may be coplanar with the second surface of the body, and the second band portion of the second external electrode may only be formed on a portion of the second surface of the body, and one end portion of the second connected portion of the second external electrode may be coplanar with the first surface of the body.

A length of the first band portion and a length of the second band portion may be the same as each other.

Each of the fifth and sixth surfaces of the body may be coplanar with each of opposite side surfaces of the first and second external electrodes.

The first and second conductive layers may include Ni, and the first and second plating layers may include Cu.

According to another aspect of the present disclosure, a method of manufacturing a multilayer ceramic electronic component may include: forming a laminate having first and second surfaces opposing each other, third and fourth surfaces connected to the first and second surfaces and opposing each other, and fifth and sixth surfaces connected to the first and second surfaces, connected to the third and fourth surfaces, and opposing each other, and including a plurality of dielectric layers and a plurality of first and second internal electrodes alternately disposed and exposed through the third and fourth surfaces, respectively, with respective dielectric layers interposed therebetween; forming a conductive layer; forming a body by sintering the laminate on which the conductive layer is formed; forming an electrode layer having a plating layer by performing plating on the conductive layer; and cutting the electrode layer using a laser beam to separate the electrode layer into first and second external electrodes of which cut surfaces of end portions are formed to be flat.

The cutting of the electrode layer using the laser beam cuts an intermediate portion of the electrode layer on the first and second surfaces of the body, remaining portions of the electrode layer on the first surfaces of the body after the cutting face each other, remaining portions of the electrode layer on the second surfaces of the body after the cutting face each other, and the remaining portions of the electrode layer on the first and second surfaces of the body are converted to a pair of band portions of the first and second external electrodes.

In the cutting of the electrode layer using the laser beam, the electrode layer may be cut so that the first external electrode does not have a portion formed on a second surface of the body and the second electrode does not have a portion formed on a first surface of the body.

In the forming of the conductive layer, the conductive paste may include Ni.

In the forming of the electrode layer, the plating layer may be formed by performing electroless Cu plating on the conductive layer.

The conductive layer may be formed by printing a conductive paste on the first to fourth surfaces of the laminate.

The conductive layer may be formed by performing an external electrode Samsung technology (EEST) process of disposing the conductive paste on the first to fourth surfaces of the laminate.

According to another aspect of the present disclosure, a printed circuit board having an embedded multilayer ceramic electronic component may include: an insulating layer; a conductive pattern disposed on at least one surface of the insulating layer; and the multilayer ceramic electronic component as described above embedded in the insulating layer and having an external electrode connected to the conductive pattern through a via.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Embedded Multilayer Ceramic Electronic Component

Hereinafter, an embedded multilayer ceramic electronic component according to an exemplary embodiment in the present disclosure, particularly, an embedded multilayer ceramic capacitor will be described. However, the present disclosure is not limited thereto.

Figure 1:
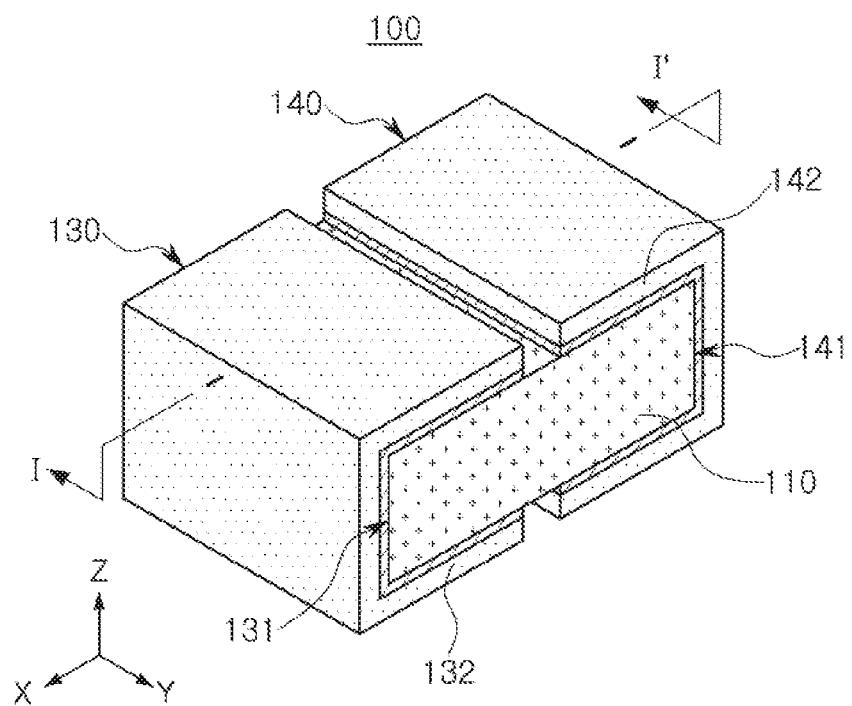
FIG. 1 is a perspective view illustrating an embedded multilayer ceramic electronic component according to an exemplary embodiment in the present disclosure.
Figure 2:
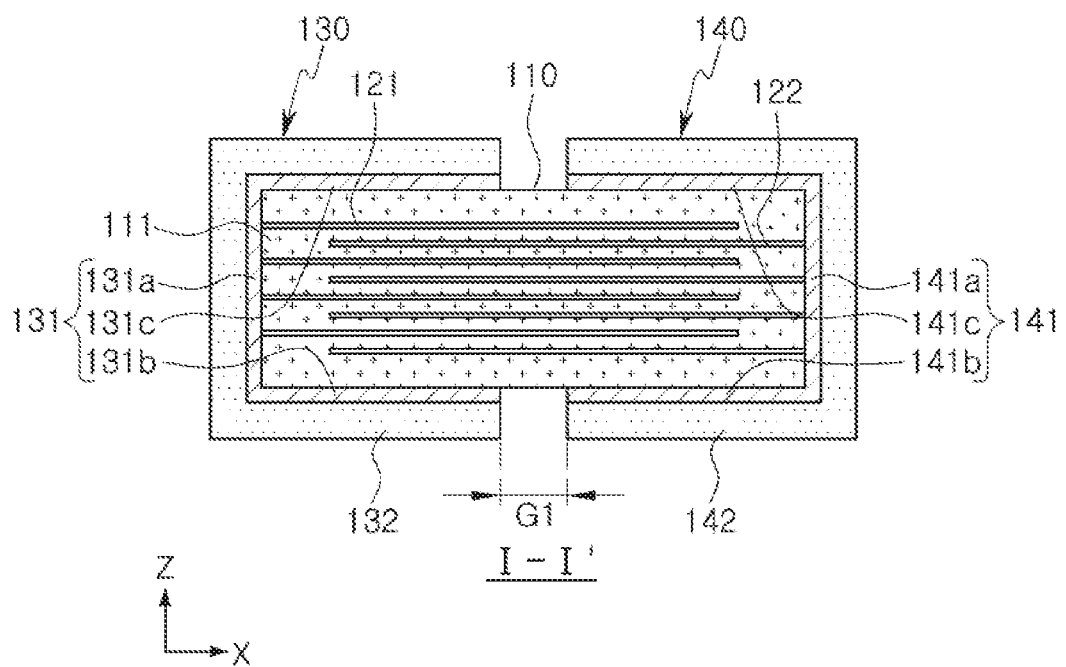
FIG. 2 is a cross-sectional view taken along line I-I' of FIG. 1.

FIG. 1 is a perspective view illustrating an embedded multilayer ceramic electronic component according to an exemplary embodiment in the present disclosure, and FIG. 2 is a cross-sectional view taken along line I-I' of FIG. 1.

Referring to FIGS. 1 and 2, an embedded multilayer ceramic electronic component 100 according to an exemplary embodiment in the present exemplary may include a body 110 and first and second external electrodes 130 and 140 disposed on outer surfaces of the body 100.

In the embedded multilayer ceramic electronic component 100 according to the exemplary embodiment, a 'length direction' refers to an 'X' direction of FIG. 1, a 'width direction' refers to a 'Y' direction of FIG. 1, and a 'thickness direction' refers to a 'Z' direction of FIG. 1.

The body 110 may have first and second surfaces opposing each other in the Z direction, third and fourth surfaces connected to the first and second surfaces and opposing each other in the X direction, and fifth and sixth surfaces connected to the first and second surfaces, connected to the third and fourth surfaces, and opposing each other in the Y direction.

In addition, the body 110 may include a plurality of dielectric layers 111 and a plurality of first and second internal electrodes 121 and 122 alternately stacked in the Z direction with one of the dielectric layers 111 interposed therebetween and disposed to face each other.

The body 110 may be formed by stacking and then sintering the plurality of dielectric layers 111 in the Z direction, and a shape and a dimension of the body 110 and the number of dielectric layers 111 stacked in the body 110 are not limited to those illustrated in the present exemplary embodiment.

In addition, the plurality of dielectric layers 111 forming the body 110 may be in a sintered state, and adjacent dielectric layers 111 may be integrated with each other so that boundaries therebetween are not readily apparent without the use of a scanning electron microscope (SEM).

A raw material of the dielectric layer 111 is not particularly limited as long as sufficient capacitance may be obtained. For example, the raw material of the dielectric layer 111 may be barium titanate ($BaTiO_3$) powder particles.

For example, a material of the dielectric layer 111 may be prepared by adding various ceramic additives, organic solvents, plasticizers, binders, dispersing agents, and the like, to powder particles such as the barium titanate ($BaTiO_3$) powder particles, or the like, according to an object of the present disclosure.

The first and second internal electrodes 121 and 122, a pair of electrodes having different polarities, may be disposed in the Z direction, which is a stacked direction of the dielectric layers 111, to be alternately exposed through the third and fourth end surfaces of the body 110, respectively, and may be electrically insulated from each other by one of the dielectric layers 111 disposed therebetween.

The first and second internal electrodes 121 and 122 may include a conductive metal such as nickel (Ni), copper (Cu), palladium (Pd), silver (Ag), lead (Pb), or platinum (Pt), or alloys thereof.

In the present exemplary embodiment, the fifth and sixth surfaces of the body 110 may be in an entirely exposed state, and the first and second external electrodes 130 and 140 may be formed to be flat so that each of opposite surfaces thereof in the Y direction form is coplanar with each of the fifth and sixth surfaces of the body 110, respectively.

Each of the first and second external electrodes 130 and 140 may have a multilayer structure. The first external electrode 130 may include a first conductive layer 131 and a first plating layer 132 disposed on the first conductive layer 131. Each of the first conductive layer 131 and the first plating layer 132 may include a first connected portion disposed on the third surface of the body 110 and a first band portion extending from the first connected portion onto one or both of the first and second surfaces of the body 110. The second external electrode 140 may include a second conductive layer 141 and a second plating layer 142 disposed on the second conductive layer 141. Each of the second conductive layer 141 and the second plating layer 142 may include a second connected portion disposed on the fourth surface of the body 110 and a second band portion extending from the second connected portion onto one or both of the first and second surfaces of the body 110.

In the following description, the connected portion and the band portion is referred to as a conductive layer, but the external electrode according to the present disclosure may be formed of an electrode layer in which a conductive layer and a plating layer are stacked.

The first and second connected portions 131a and 141a of the first and second conductive layers 131 and 141 according to the present exemplary embodiment may be disposed on the third and fourth surfaces of the body 110, respectively, and may be electrically connected to exposed portions of the first and second internal electrodes 121 and 122, respectively.

The first and second band portions of the first and second conductive layers 131 and 141 may extend from the first and second connected portions 131a and 141a to portions of at least one of the first and second surfaces of the body 110, respectively.

In the present exemplary embodiment, the first and second band portions may include first and second lower band portions 131b and 141b extending from lower ends of the first and second connected portions 131a and 141a to portions of the first surface of the body 110, respectively, and may further include first and second upper band portions 131c and 141c extending from upper ends of the first and second connected portions 131a and 141a to portions of the second surface of the body 110, respectively.

In addition, the first and second lower band portions 131b and 141b may be disposed to face each other with a predetermined gap interposed therebetween in the X direction, and the first and second upper band portions 131c and 141c may be disposed to face each other with a predetermined gap interposed therebetween in the X direction.

In this case, lengths of the first and second lower band portions 131b and 141b in the X direction may be the same as each other, and lengths of the first and second upper band portions 131c and 141c in the X direction may be the same as each other.

In addition, the first lower band portion 131b and the first upper band portion 131c may be disposed to face each other in the Z direction, and the second lower band portion 141b and the second upper band portion 141c may be disposed to face each other in the Z direction.

In this case, lengths of the first lower band portion 131b and the first upper band portion 131c may be the same as each other, and lengths of the second lower band portion 141b and the second upper band portion 141c may be the same as each other.

In an embedded multilayer ceramic electronic component according to the related art, a gap between the first and second lower band portions or between the first and second upper band portions needs to be 50 µm or more in consideration of plating spreading.

However, in the present exemplary embodiment, end portions of the first and second band portions are cut using a laser beam, and cut surfaces of the end portions of the first and second band portions may thus be formed to be flat.

Therefore, a gap G1 between the first and second lower band portions 131b and 141b or a gap between the first and second upper band portions 131c and 141c may be decreased up to at least 10 µm.

When lengths of the first and second band portions are increased as much as possible as described above, contact areas of the first and second band portions are further secured, and a connection defect occurring when vias for wiring connection are drilled in a board manufacturer may thus be significantly decreased.

The first and second external electrodes 130 and 140 may include the first and second conductive layers 131 and 141 disposed on the body 110 and the first and second plating layers 132 and 142 disposed on the first and second conductive layers 131 and 141, respectively.

In this case, the first and second conductive layers 131 and 141 may be formed by printing Ni or performing an external electrode Samsung technology (EEST) process of Ni, and the first and second plating layers 132 and 142 may be formed by plating Cu on surfaces of the first and second conductive layers 131 and 141.

In the related art, when an external electrode is formed, a dipping method using a paste including a conductive metal is mainly used.

In order to connect the external electrodes of the embedded multilayer ceramic capacitor and external wirings to each other through the vias, the band portions of the external electrodes need to be formed at a predetermined area or more. However, in the dipping method according to the related art, when the band portions are formed at a predetermined width or more, end portions of the band portions become convex due to interfacial tension of the paste.

When the end portion of the band portion becomes convex as described above, a gap between adjacent external electrodes having different polarities is decreased, such that the external electrodes having the different polarities may be in contact with each other unlike a design to generate a short-circuit, and it is difficult to adjust the gap between the external electrodes.

According to the exemplary embodiment in the present disclosure, the first and second external electrodes may be formed by forming the conductive layers on opposite end surfaces and upper and lower surfaces of the body, forming the plating layers on the conductive layers by plating, and then cutting the plating layers and the conductive layers using the laser beam. Therefore, cut surfaces of end portions of the first and second external electrode may be formed to be flat, such that a deviation of the gap between the band portions may be significantly decreased, a size of the gap between the band portions may be easily adjusted, and areas of the band portions for connecting the vias for wiring connection may further be secured.

Modified Example

Figure 3:
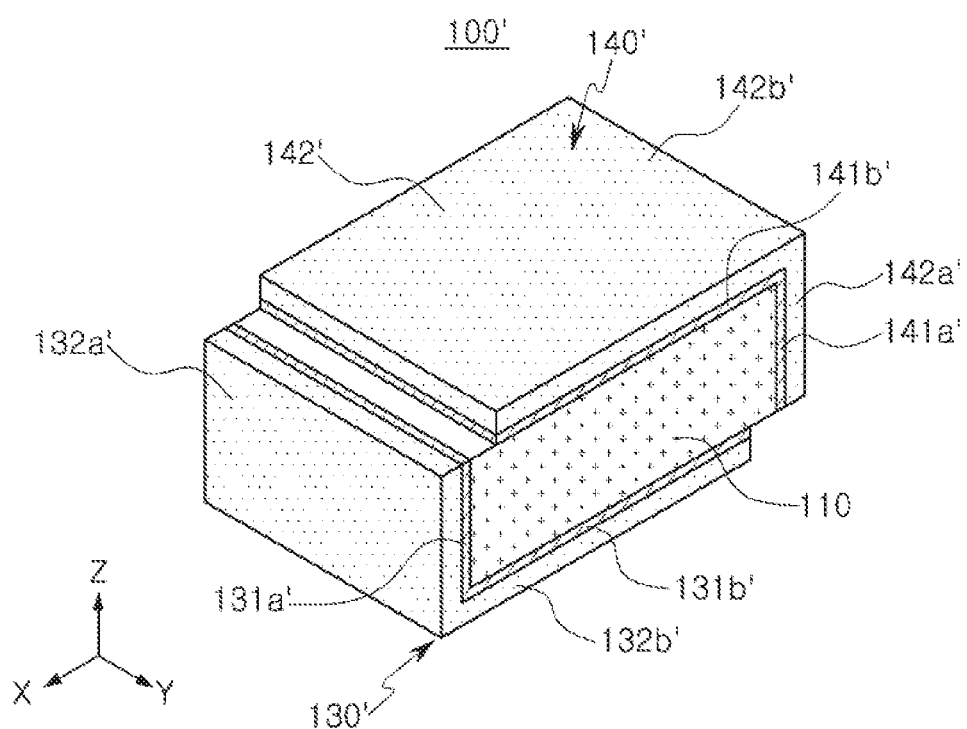
FIG. 3 is a perspective view illustrating an embedded multilayer ceramic electronic component according to another exemplary embodiment in the present disclosure.

FIG. 3 is a perspective view illustrating an embedded multilayer ceramic electronic component 100' according to another exemplary embodiment in the present disclosure.

Here, since structures of a body 110 and first and second internal electrodes of the embedded multilayer ceramic electronic component 100' are similar to those of the body 110 and the first and second internal electrodes 121 and 122 according to the abovementioned exemplary embodiment, a detailed description therefor is omitted in order to avoid an overlapping description, and first and second external electrodes having structures different from those of the first and second external electrodes according to the abovementioned exemplary embodiment are described in detail.

Referring to FIG. 3, a first band portion 131b' of a first external electrode 130' may only be formed on the first surface of the body 110. In this case, an upper end portion of a first connected portion 131a' may be formed to be coplanar with the second surface of the body 110.

A second band portion 141b' of a second external electrode 140' may only be formed on the second surface of the body 110. In this case, a lower end portion of a second connected portion 141a' may be formed to be coplanar with the first surface of the body 110.

In addition, a length, in the X direction, of the first band portion 131b' formed on the first surface of the body 110 and a length, in the X direction, of the second band portion 141b' formed on the second surface of the body 110 may be the same as each other.

In addition, reference numerals 132' and 142' denotes first and second plating layers formed on conductive layers, respectively.

In the abovementioned exemplary embodiment, erroneous drilling and a short-circuit due to a drilling deviation of the vias may occur. However, in the present exemplary embodiment, only one band portion of each of the external electrodes is disposed on each of the first and second surfaces of the body, and areas of the band portions are thus significantly greater those of the band portions according to the abovementioned exemplary embodiment. Therefore, the vias may be drilled regardless of a deviation.

Method of Manufacturing Embedded Multilayer Ceramic Electronic Component

In a method of manufacturing an embedded multilayer ceramic electronic component according to the exemplary embodiment, a plurality of ceramic sheets may be first prepared by applying a slurry including powder particles such as barium titanate ($BaTiO_3$) powder particles, or the like, to carrier films and then drying the slurry applied to the carrier films.

The ceramic sheet including may be manufactured by mixing ceramic powder particles such as the barium titanate ($BaTiO_3$) powder particles, binders, solvents, and the like, with one another to prepare a slurry and manufacturing the slurry in a sheet shape having a thickness of several micrometers by a doctor blade method.

Then, a conductive paste for an internal electrode including a conductive metal may be prepared. The conductive metal may be nickel (Ni), copper (Cu), palladium (Pd), silver (Ag), lead (Pb), platinum (Pt), or alloys thereof.

In addition, internal electrode patterns may be formed by applying the conductive paste for an internal electrode to the ceramic sheets by a printing method, or the like.

In this case, a method of printing the conductive paste may be a screen printing method, a gravure printing method, or the like. However, the method of printing the conductive paste is not limited thereto.

Figure 4:
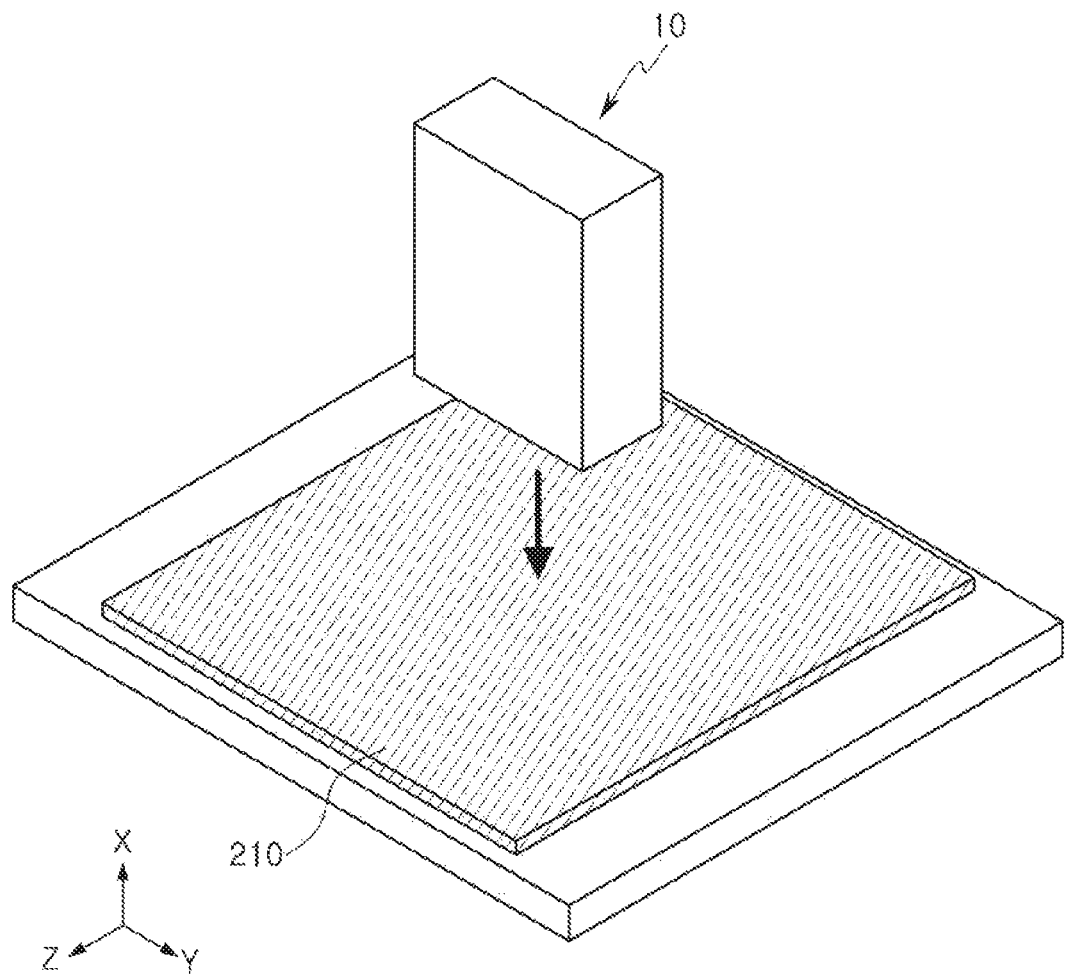
FIGS. 4 through 8 are perspective views sequentially illustrating processes of manufacturing an embedded multilayer ceramic electronic component according to an exemplary embodiment in the present disclosure.

In addition, a laminate 10 of FIG. 4 including a plurality of dielectric layers and first and second internal electrodes disposed with each of the plurality of dielectric layers interposed therebetween may be prepared by stacking the plurality of ceramic sheets on which the internal electrode patterns are printed.

In this case, the laminate 10 may have first and second surfaces opposing each other, third and fourth surfaces connected to the first and second surfaces and opposing each other, and fifth and sixth surfaces connected to the first and second surfaces, connected to the third and fourth surfaces, and opposing each other, and the first and second internal electrodes may be disposed to be alternately exposed through the third and fourth surfaces, respectively.

Figure 5:
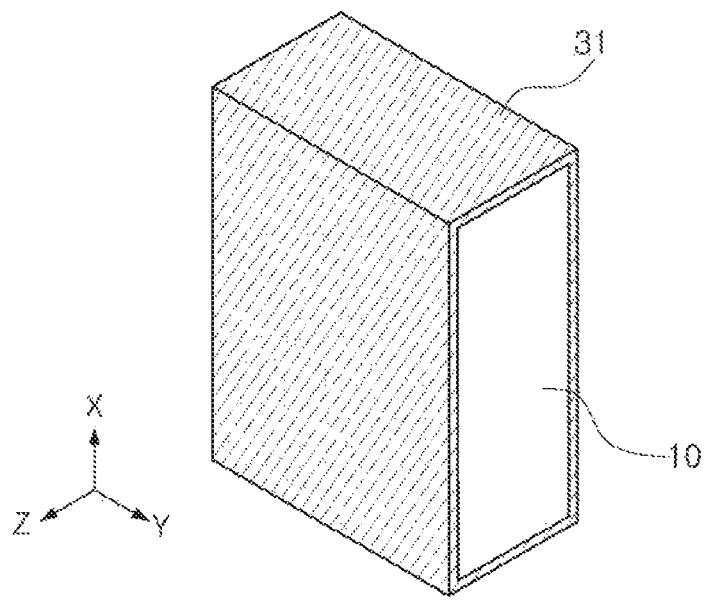

Then, a conductive layer 31 of FIG. 5 may be formed by printing a conductive paste 210 (shown in FIG. 4) or performing an EEST process of the conductive paste 210 on the entirety of the first to fourth surfaces of the laminate 10.

In this case, in a process of forming the conductive layer 31, the conductive paste 210 may include Ni as a conductive metal.

Since external electrodes according to the related art are formed by applying a paste including copper (Cu) to opposite surfaces of a body and then performing plating, a flexion may be generated depending on a thickness of the electrode. Therefore, a pore is generated due to a step generated in a process of filling epoxy, or the like, in a substrate and then hardening the epoxy.

On the other hand, in the present exemplary embodiment, the paste including copper (Cu) is not applied to the body at the time of forming the external electrodes unlike the related art, outer surfaces of band portions of the external electrodes may be relatively flat, and flatness of the band portions of the external electrodes may thus be significantly improved. Therefore, in a process of filling a resin in a substrate and then hardening the resin, an adhesive property and workability may be improved, and a problem such as generation of a pore may be solved.

Figure 6:
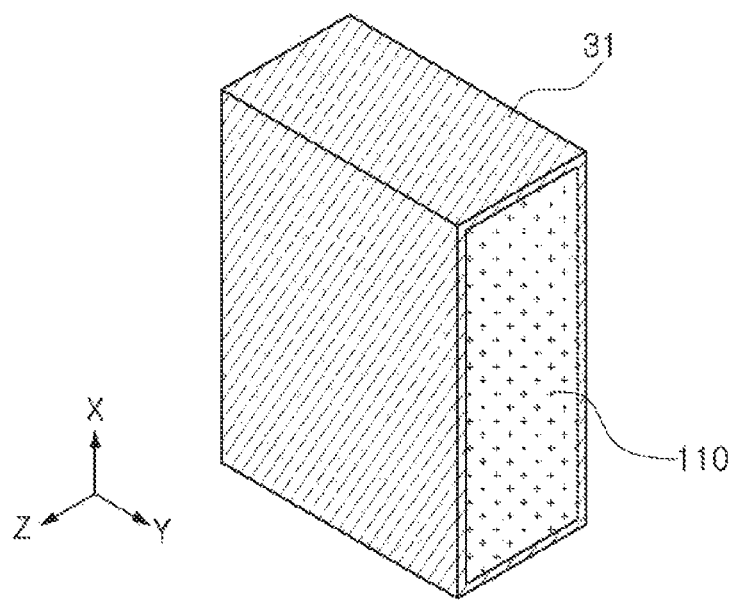

Then, a body 110 of FIG. 6 may be formed by sintering the laminate 10 on which the conductive layer 31 is formed.

Figure 7:
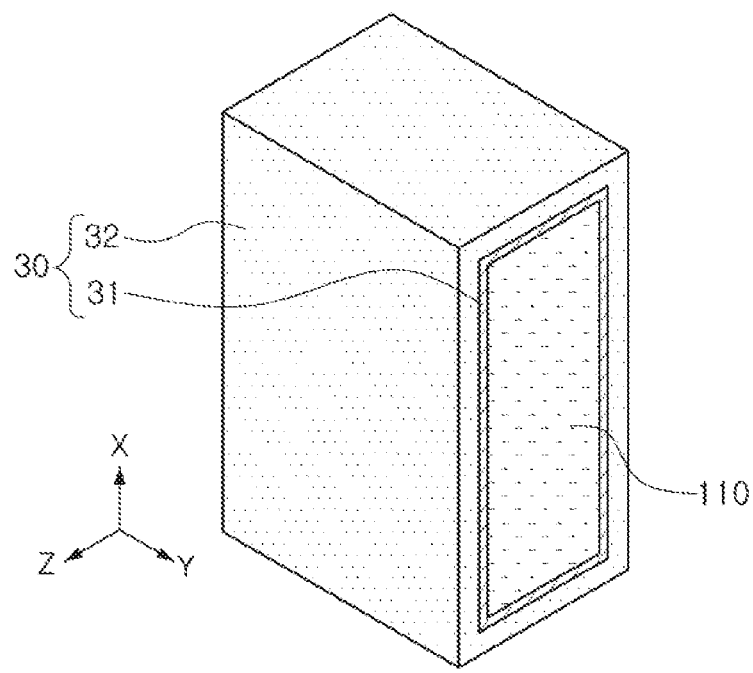

Then, as illustrated in FIG. 7, an electrode layer 30 having a plating layer 32 may be formed by performing plating on the conductive layer 31.

In this case, in a process of forming the electrode layer 30, the plating layer 32 may be formed by performing electroless Cu plating on the conductive layer 31.

Figure 8:
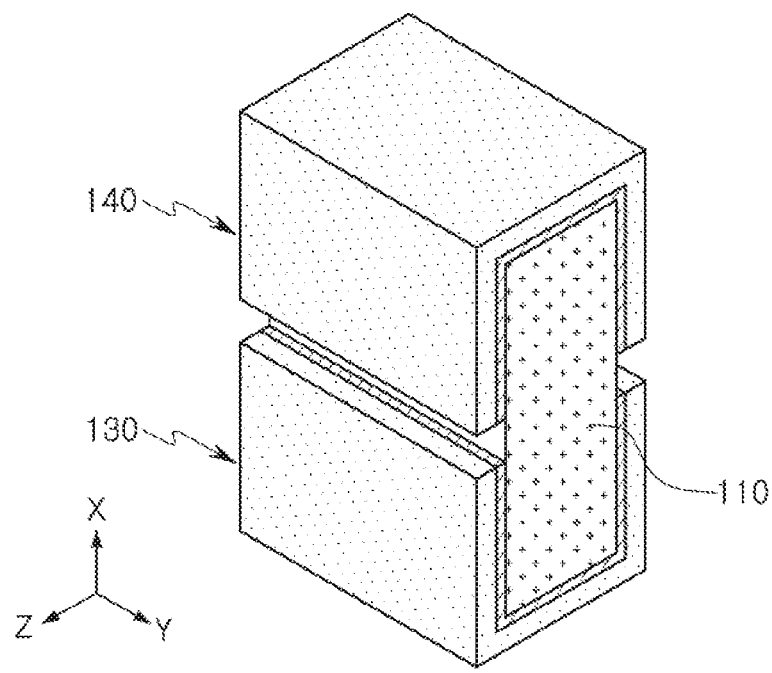

Then, the electrode layer 30 including the conductive layer 31 and the plating layer 32 may be cut using a laser beam to separate the electrode layer 30 into first and second external electrodes 130 and 140 as illustrated in FIG. 8.

In this case, cut surfaces of end portions of the first and second external electrodes 130 and 140 may be formed to be flat by the cutting using the laser beam.

In addition, in a process of cutting the electrode layer 30 using the laser beam, the electrode layer 30 may be cut so that the first and second external electrodes 130 and 140 each have a pair of band portions formed on the first and second surfaces of the body 110 to face each other. Therefore, an embedded multilayer ceramic electronic component according to an exemplary embodiment illustrated in FIG. 8 may be manufactured.

In this case, first and second band portions formed on the first surface or the second surface of the body 110 to face each other in the X direction may be formed to face each other in relation to a central portion of the body in the X direction, and may have the same length.

Figure 9:
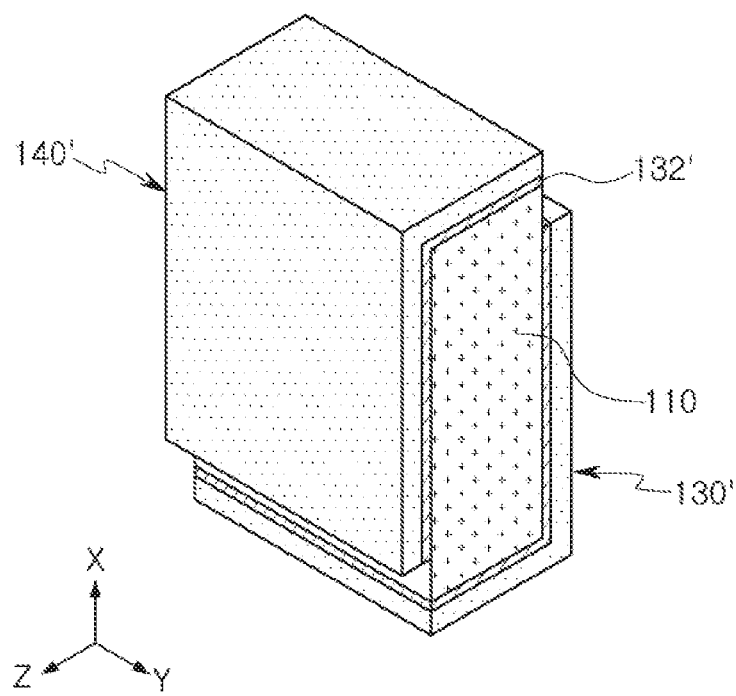
FIG. 9 is a perspective view illustrating a state in which the multilayer ceramic electronic component of FIG. 3 rotates by 90°.

Meanwhile, in another example of a process of cutting the electrode layer 30 using the laser beam, as illustrated in FIG. 9, the electrode layer 30 may be cut so that a first external electrode 130' does not have a portion formed on the second surface of the body 110 and a second electrode 140' does not have a portion formed on the first surface of the body 110.

In this case, a ratio between a length of a first band portion in the X direction and a length, in the length direction, of a portion in which the first band portion is not formed on the first surface of the body may be 9:1, and a ratio between a length of a second band portion in the X direction and a length, in the length direction, of a portion in which the second band portion is not formed on the second surface of the body may be 9:1.

When the external electrodes are formed in a printing manner according to the related art, it is difficult to secure a process capability index (Cpk) due to a printing deviation or plating spreading.

However, when the first and second electrodes are formed by printing the conductive layer on the entirety of the first to fourth surfaces of the body, forming the plating layer on the conductive layer to form the electrode layer, and then cutting the electrode layer using the laser beam as in the present exemplary embodiment, the printing deviation or the plating spreading is not generated, such that the cut surfaces of the end portions of the first and second external electrodes may be formed to be flat. Therefore, the deviation of the gap between the band portions may be significantly decreased, the size of the gap between the band portions may be easily adjusted, and the areas of the band portions for connecting the vias for wiring connection may further be secured, such that the vias may be more easily drilled.

Printed Circuit Board Having Embedded Ceramic Electronic Component

Figure 10:
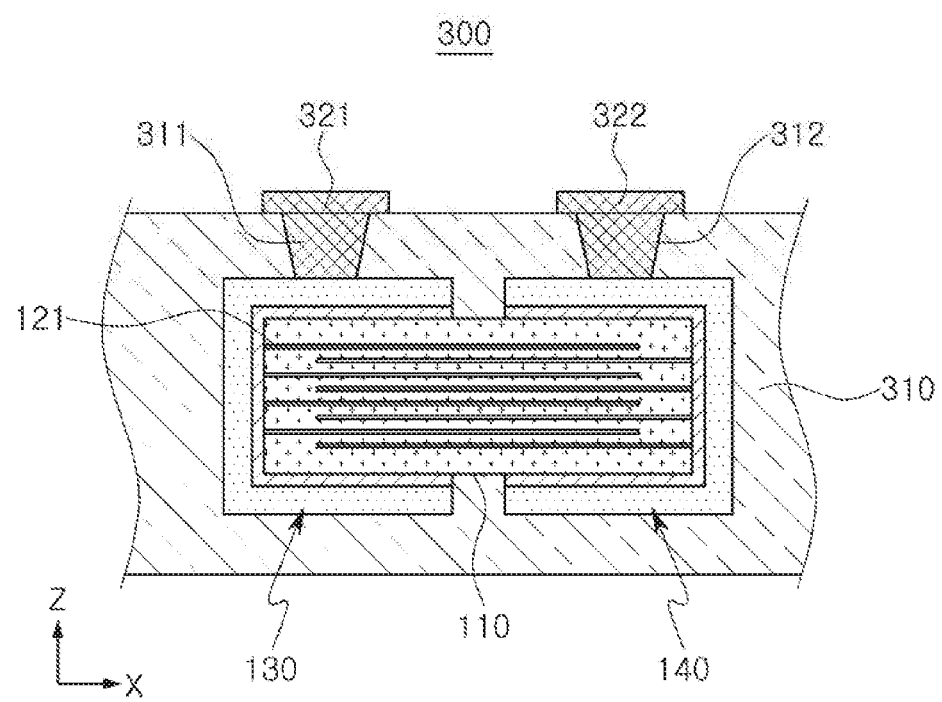
FIG. 10 is a schematic cross-sectional view illustrating a printed circuit board having an embedded multilayer ceramic electronic component according to an exemplary embodiment in the present disclosure.

FIG. 10 is a cross-sectional view illustrating a printed circuit board having an embedded multilayer ceramic electronic component according to an exemplary embodiment in the present disclosure.

Referring to FIG. 10, a printed circuit board 300 having an embedded multilayer ceramic electronic component according to an exemplary embodiment in the present disclosure may include an insulating layer 310, conductive patterns 321 and 322 disposed on at least one surface of the insulating layer 310, and the embedded multilayer ceramic electronic component embedded in the insulating layer 310.

In the present exemplary embodiment, the embedded multilayer ceramic electronic component according to the exemplary embodiment illustrated in FIG. 1 is illustrated and described as the embedded multilayer ceramic electronic component. However, the embedded multilayer ceramic electronic component is not limited thereto, but may also be, for example, the embedded multilayer ceramic electronic component illustrated in FIG. 3.

Characteristics of the embedded multilayer ceramic electronic component are the same as those of the embedded multilayer ceramic electronic component according to the exemplary embodiment in the present disclosure described above, and a description thereof is thus omitted.

Vias 311 and 312 connecting the band portions of the first and second plating layers of the first and second external electrodes 130 and 140 of the embedded multilayer ceramic electronic component and conductive patterns to each other may be formed in the insulating layer 310 of the printed circuit board 300.

Therefore, external wirings of the printed circuit board 300 and the embedded multilayer ceramic electronic component may be electrically connected to each other through the vias 311 and 312.

As set forth above, according to the exemplary embodiment in the present disclosure, the first and second external electrodes may be formed by forming the conductive layers on the opposite end surfaces and the upper and lower surfaces of the body, forming the plating layers on the conductive layers by plating, and then performing cutting using the laser beam. Therefore, the cut surfaces of the end portions of the first and second external electrode may be formed to be flat, such that a deviation of the gap between the band portions may be significantly decreased, a size of the gap between the band portions may be easily adjusted, and areas of the band portions for connecting the vias for wiring connection may further be secured.

While exemplary embodiments have been shown and described above, it will be apparent to those skilled in the art that modifications and variations could be made without departing from the scope of the present invention as defined by the appended claims.

What is claimed is:

1. A multilayer ceramic electronic component comprising:
   a body having first and second surfaces opposing each other, third and fourth surfaces connected to the first and second surfaces and opposing each other, and fifth and sixth surfaces connected to the first and second surfaces, connected to the third and fourth surfaces, and opposing each other, and including a plurality of dielectric layers and a plurality of first and second internal electrodes alternately disposed and exposed through the third and fourth surfaces, respectively, with respective dielectric layers interposed therebetween; and
   first and second external electrodes disposed on the third and fourth surfaces of the body, respectively, and including first and second connected portions connected to the first and second internal electrodes, respectively, and first and second band portions extending from the first and second connected portions to portions of at least one of the first and second surfaces of the body, respectively,
   wherein the first and second external electrodes include first and second conductive layers disposed on the body, respectively, and first and second plating layers disposed on the first and second conductive layers, respectively, and
   surfaces of end portions of the first and second external electrodes are flat,
   the first band portion of the first external electrode is disposed only on a portion of the first surface of the body, and one end portion of the first connected portion of the first external electrode is coplanar with the second surface of the body, and
   the second band portion of the second external electrode is disposed only on a portion of the second surface of the body, and one end portion of the second connected portion of the second external electrode is coplanar with the first surface of the body.

2. The multilayer ceramic electronic component of claim 1,
   the first and second band portions overlap each other in a stacking direction of the plurality of dielectric layers.

3. The multilayer ceramic electronic component of claim 1, wherein a length of the first band portion and a length of the second band portion are the same as each other.

4. The multilayer ceramic electronic component of claim 1, wherein each of the fifth and sixth surfaces of the body is coplanar with each of opposite side surfaces of the first and second external electrodes.

5. The multilayer ceramic electronic component of claim 1, wherein the first and second conductive layers include Ni, and the first and second plating layers include Cu.

6. A method of manufacturing a multilayer ceramic electronic component, comprising:
   forming a laminate having first and second surfaces opposing each other, third and fourth surfaces connected to the first and second surfaces and opposing each other, and fifth and sixth surfaces connected to the first and second surfaces, connected to the third and fourth surfaces, and opposing each other, and including a plurality of dielectric layers and a plurality of first and second internal electrodes alternately disposed and exposed through the third and fourth surfaces, respectively, with respective dielectric layers interposed therebetween;

forming a conductive layer which extends continuously from the third to fourth surfaces passing through both the first and second surfaces;

forming a body by sintering the laminate on which the conductive layer is formed;

forming an electrode layer having a plating layer by performing plating on the conductive layer such that the electrode layer extends continuously from the third to fourth surfaces passing through both the first and second surfaces; and after forming the electrode layer, cutting the electrode layer using a laser beam to separate the electrode layer into first and second external electrodes of which cut surfaces of end portions are formed to be flat.

7. The method of claim 6, wherein the cutting of the electrode layer using the laser beam cuts an intermediate portion of the electrode layer on the first and second surfaces of the body, remaining portions of the electrode layer on the first surfaces of the body after the cutting face each other, remaining portions of the electrode layer on the second surfaces of the body after the cutting face each other, and the remaining portions of the electrode layer on the first and second surfaces of the body are converted to a pair of band portions of the first and second external electrodes.

8. The method of claim 6, wherein in the cutting of the electrode layer using the laser beam, the electrode layer is cut so that the first external electrode does not have a portion formed on the second surface of the body and the second electrode does not have a portion formed on the first surface of the body.

9. The method of claim 6, wherein in the forming of the conductive layer, conductive paste including Ni is used to form the conductive layer.

10. The method of claim 6, wherein in the forming of the electrode layer, the plating layer is formed by performing electroless Cu plating on the conductive layer.

11. The method of claim 6, wherein the conductive layer is formed by printing a conductive paste on the first to fourth surfaces of the laminate.

12. The method of claim 6, wherein the conductive layer is formed by disposing the conductive paste on the first to fourth surfaces of the laminate.

13. A printed circuit board having an embedded multilayer ceramic electronic component, comprising:

an insulating layer;

a conductive pattern disposed on at least one surface of the insulating layer; and the multilayer ceramic electronic component of claim 1 embedded in the insulating layer and having an external electrode connected to the conductive pattern through a via.

14. A multilayer ceramic electronic component comprising:

a body having first and second surfaces opposing each other, third and fourth surfaces connected to the first and second surfaces and opposing each other, and fifth and sixth surfaces connected to the first and second surfaces, connected to the third and fourth surfaces, and opposing each other, and including a plurality of dielectric layers and a plurality of first and second internal electrodes alternately disposed and exposed through the third and fourth surfaces, respectively, with respective dielectric layers interposed therebetween;

a first external electrode disposed on the third fourth surface of the body and including a first connected portion connected to the first internal electrodes, and a first band portion extending from the first connected portion to cover a portion of only one of the first and second surfaces of the body or to cover portions only the first and second surfaces of the body; and a second external electrode disposed on the fourth surface of the body and including a second connected portion connected to the second internal electrodes, and a second band portion extending from the second connected portion to cover a portion of only one of the first and second surfaces of the body or to cover portions of only the first and second surfaces of the body.

15. The multilayer ceramic electronic component of claim 14, wherein the first and second external electrodes include first and second conductive layers disposed on the body, respectively, and first and second plating layers disposed on the first and second conductive layers, respectively.

16. The multilayer ceramic electronic component of claim 14, wherein surfaces of end portions of the first and second external electrodes are flat.

17. The multilayer ceramic electronic component of claim 14, wherein the first and second band portions of the first and second external electrodes include first and second lower band portions extending from one ends of the first and second connected portions to portions of the first surface of body, respectively, and first and second upper band portions extending from the other ends of the first and second connected portions to portions of the second surface of the body, respectively, and the first and second lower band portions and the first and second upper band portions face each other in a length direction.

18. The multilayer ceramic electronic component of claim 17, wherein lengths of the first and second lower band portions are the same as each other, and lengths of the first and second upper band portions are the same as each other.

19. The multilayer ceramic electronic component of claim 17, wherein a gap between the first and second lower band portions or a gap between the first and second upper band portions is 10 μm or more.

20. The multilayer ceramic electronic component of claim 14, wherein the first band portion of the first external electrode is disposed only on a portion of the first surface of the body, and one end portion of the first connected portion of the first external electrode is coplanar with the second surface of the body, and the second band portion of the second external electrode is disposed only on a portion of the second surface of the body, and one end portion of the second connected portion of the second external electrode is coplanar with the first surface of the body.

* * * * *